United States Patent
Kang et al.

(10) Patent No.: US 10,774,870 B2
(45) Date of Patent: Sep. 15, 2020

(54) VACUUM SUCTION DEVICE AND ELECTRONIC DEVICE INCLUDING THE SAME

(71) Applicant: Samsung Electronics Co., Ltd., Suwon-si, Gyeonggi-do (KR)

(72) Inventors: Yoon-Seok Kang, Seoul (KR); Min-Hyuk Nam, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 15/806,157

(22) Filed: Nov. 7, 2017

(65) Prior Publication Data
US 2018/0135688 A1     May 17, 2018

(30) Foreign Application Priority Data
Nov. 16, 2016 (KR) .......................... 10-2016-0152514

(51) Int. Cl.
*F16B 47/00*      (2006.01)
*H05K 5/02*      (2006.01)

(52) U.S. Cl.
CPC ........... *F16B 47/00* (2013.01); *H05K 5/0213* (2013.01); *H05K 5/0217* (2013.01)

(58) Field of Classification Search
CPC combination set(s) only.
See application file for complete search history.

(56) References Cited

U.S. PATENT DOCUMENTS

| | | | |
|---|---|---|---|
| 3,593,983 A | 7/1971 | Csenyi | |
| 4,196,882 A * | 4/1980 | Rognon | F16B 47/00 248/205.9 |
| 5,381,990 A * | 1/1995 | Belokin | F16B 47/00 248/205.9 |
| 5,511,752 A | 4/1996 | Trethewey | |
| 5,553,837 A * | 9/1996 | Kahle | B25B 11/005 269/21 |
| 6,042,095 A * | 3/2000 | Kuchta | A41H 43/0292 269/21 |

(Continued)

FOREIGN PATENT DOCUMENTS

| | | |
|---|---|---|
| CN | 1375043 A | 10/2002 |
| CN | 2558807 Y | 7/2003 |

(Continued)

OTHER PUBLICATIONS

Foreign Communication from Related Counterpart Application; European Patent Application No. 17201649.5; Extended European Search Report and European Search Opinion dated Mar. 26, 2018; 6 pages.

(Continued)

*Primary Examiner* — Monica E Millner

(57) ABSTRACT

A vacuum suction device including a suction pad having a concave inner surface. The vacuum suction device also includes a vent hole penetrating from the concave inner surface of the suction pad to an outer surface of the suction pad. The vacuum suction device also includes a valve member disposed on the outer surface of the suction pad. As a pressure of a space, formed by an inner space of the suction pad, decreases, the valve member closes the vent hole from the outer surface of the suction pad.

12 Claims, 13 Drawing Sheets

(56) References Cited

U.S. PATENT DOCUMENTS

| | | | |
|---|---|---|---|
| 6,827,344 B1 | 12/2004 | Ristau | |
| 7,690,610 B2 * | 4/2010 | Ristau | F16B 47/00 248/205.5 |
| 8,783,634 B2 * | 7/2014 | Summers | F16B 47/00 248/205.5 |
| 9,803,680 B2 * | 10/2017 | Potters | A47G 1/17 |
| 2012/0112023 A1 | 5/2012 | Tollman | |
| 2013/0168523 A1 | 7/2013 | Summers et al. | |
| 2015/0377280 A1 | 12/2015 | Potters et al. | |
| 2016/0031092 A1 | 2/2016 | Li | |

FOREIGN PATENT DOCUMENTS

| | | |
|---|---|---|
| CN | 102459933 A | 5/2012 |
| CN | 203453258 U | 2/2014 |
| CN | 204729452 U | 10/2015 |
| CN | 105317816 A | 2/2016 |
| DE | 8813521 U1 | 3/1989 |
| DE | 29916197 U1 | 3/2000 |
| JP | 2002295441 A | 10/2002 |
| KR | 10-1514737 B1 | 4/2015 |
| TW | M467755 U | 12/2013 |
| WO | 2014117766 A2 | 8/2014 |

OTHER PUBLICATIONS

The First Office Action in connection with Chinese Application No. 201711141783.5 dated Jun. 24, 2020, 15 pages.

\* cited by examiner

VACUUM SUCTION DEVICE AND ELECTRONIC DEVICE INCLUDING THE SAME

CROSS-REFERENCE TO RELATED APPLICATION(S) AND CLAIM OF PRIORITY

This application is related to and claims priority to Korean Application No. 10-2016-0152514 filed on Nov. 16, 2016, the contents of which are incorporated herein by reference.

TECHNICAL FIELD

The present disclosure relates to a fixing device, for example, a vacuum suction device and an electronic device including the same.

BACKGROUND

A vacuum suction device has a semi-spherical or conical suction pad of synthetic rubber or flexible plastic which is sucked to a tile wall or a glass surface. As the internal pressure of the suction pad decreases, the suction pad may be kept sucked to a plane (for example, a tile wall, a glass surface, or a floor). Such a vacuum suction device may be useful in the bathroom or the kitchen in daily living, and may also be used to carry various parts such as large-sized glass in industrial sites.

A variety of electronic devices or goods are used in households or offices, inclusive of audio or video players, and devices for building a wireless communication environment. For example, a standing screen used along with a projector, multi-channel speakers, a small-sized Bluetooth speaker, a wireless frequency relay (for example, a Wireless Fidelity (WiFi) router), a desktop charger or cradle for a mobile communication terminal, and a small-sized desktop computer are devices commonly used indoors.

Such devices as placed in an indoor space or on a desk may be changed in position or fall down due to contact or collision with other objects. The vacuum suction device may be useful in stably positioning these devices (for example, a standing screen or speaker, a Bluetooth speaker, or a small-sized desktop computer).

Although such a device(s) may be stably placed by means of the vacuum suction device, the use of the vacuum suction device may make it inconvenient to carry the device(s). For example, in order to remove the suction pad from the floor, an edge of the suction pad should be raised up. In certain embodiments the suction pad may be hidden by the device (s). While a part of the edge of the suction pad may be protruded outward from the device(s), this may not be pleasing in outward looks. Moreover, a device such as a Bluetooth speaker may be moved often to the living room or the bedroom even in an indoor space, and when needed, a user may carry the Bluetooth speaker. For example, although a device(s) may be stably placed by means of the vacuum suction device, the vacuum suction device makes it difficult to remove the device placed on a plane, thus causing inconvenience to a user who often moves a device to which the vacuum suction device is mounted.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide at least the advantages described below. Accordingly, an aspect of the present disclosure is to provide a vacuum suction device for enabling staple positioning of various devices including a desktop computer, a Bluetooth speaker, and a desktop charger, and/or an electronic device including the same.

Another aspect of the present disclosure is to provide a vacuum suction device for enabling staple positioning of various devices and facilitating relocation of the devices, and/or an electronic device including the same.

In accordance with an aspect of the present disclosure, there is provided a vacuum suction device and/or an electronic device including the same. The vacuum suction device and/or the electronic device including the same may include a suction pad having a concave inner surface, a vent hole penetrating from the inner surface of the suction pad to an outer surface of the suction pad, and a valve member disposed on the outer surface of the suction pad. As a pressure of a space formed by the inner space of the suction pad decreases, the valve member may close the vent hole from the outer surface of the suction pad.

In accordance with another aspect of the present disclosure, there is provided a vacuum suction device and/or an electronic device including the same. The vacuum suction device and/or the electronic device including the same may include a suction pad having a concave inner surface, at least one first vent hole penetrating from the inner surface of the suction pad to an outer surface of the suction pad, a valve member engaged rotatably with the outer surface of the suction pad, and at least one second vent hole formed in the valve member. As the valve member rotates with respect to the suction pad, the at least one second vent hole may be selectively aligned with the at least one first vent hole.

In the vacuum suction device, the suction pad may be disposed on a bottom surface of the housing. As the space of the inner surface of the suction pad is contacted by the weight of a housing of the electronic device and/or electronic parts contained in the housing of the electronic device, the suction pad may be sucked to a plane (for example, a floor). For example, as the pressure of a space formed on the inner surface of the suction pad decreases, the suction pad may be sucked to the plane.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

The above and other aspects, features and advantages of certain exemplary embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
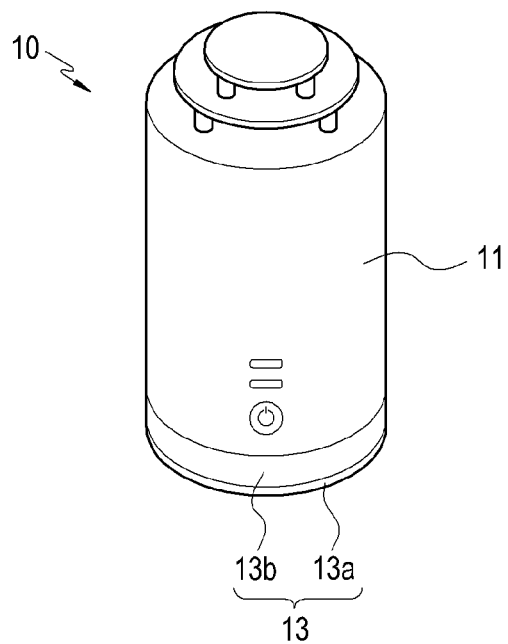
FIG. 1 illustrates a perspective view of an exemplary electronic device including a vacuum suction device according to various embodiments of the present disclosure.

FIGS. 1 through 27, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device.

The present disclosure may be subjected to various modifications and have various embodiments. Specific embodiments of the present disclosure are described with reference to the accompanying drawings. However, the embodiments are not intended to limit the present disclosure, and it is to be understood that the present disclosure covers various modifications, equivalents, and/or alternatives to the embodiments.

Ordinal terms as used in the present disclosure, such as 'first' and 'second' may be used to describe various components, not limiting the components. These expressions are used to distinguish one component from another component. For example, a first component may be referred to as a second component and vice versa without departing from the scope of the present disclosure. The term 'and/or' includes a combination or any of a plurality of related items.

The relative terms such as 'front surface', 'rear surface', 'top surface', and 'bottom surface' described as they are shown in the drawings may be replaced with ordinal terms such as 'first', 'second', and the like. The sequence of the ordinal numbers such as 'first', 'second', and the like is determined as mentioned or arbitrarily, and thus may be changed freely when needed.

The terms as used in the present disclosure are provided to describe merely specific embodiments, not intended to limit the scope of the present disclosure. It is to be understood that singular forms include plural referents unless the context clearly dictates otherwise. In the present disclosure, the term 'have', 'may have', 'include', or 'may include' signifies the presence of a specific feature, number, step, operation, component, part, or combination thereof, not excluding the presence of one or more other features, numbers, steps, operations, components, parts, or combinations thereof.

Unless otherwise defined, the terms and words including technical or scientific terms used in the following description and claims may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

According to the present disclosure, an electronic device may be any device equipped with a touch panel, and an electronic device may also be called a terminal, a portable terminal, a mobile terminal, a communication terminal, a portable communication terminal, a portable mobile terminal, a display device, or the like.

For example, an electronic device may be a smart phone, a portable phone, a navigation device, a game console, a television (TV), an in-vehicle head unit, a laptop computer, a tablet computer, a portable multimedia player (PMP), a personal digital assistant (PDA), or the like. An electronic device may be configured as a pocket-size portable communication terminal equipped with a wireless communication function. Further, an electronic device may be a flexible device or a flexible display device.

The electronic device may communicate with an external electronic device such as a server or perform a task through interaction with an external electronic device. For example, the electronic device may transmit an image captured by a camera and/or location information detected by a sensor unit to a server through a network. The network may be, but not limited to, a mobile or cellular communication network, a local area network (LAN), a wireless local area network (WLAN), a wide area network (WAN), the Internet, a small area network (SAN), or the like.

FIG. 1 illustrates a perspective view of an electronic device 10 including a vacuum suction device 13 according to various embodiments of the present disclosure.

Referring to FIG. 1, the electronic device 10 is, for example, a desktop computer in which a speaker device may be provided at the top of a housing 11 and the vacuum suction device 13 may be provided at the bottom of the housing 11. The housing 11 is roughly cylindrical, and may include a main circuit board and/or an auxiliary circuit board, with a processor, a communication module, an audio module, a storage medium, and a power module mounted thereon.

The vacuum suction device 13 may include, for example, a suction pad 13a and a cover member 13b. The suction pad 13a may be molded of synthetic rubber or flexible plastic, and may be disposed on the bottom surface of the housing 11 through the cover member 13b. In an embodiment, the cover member 13b may be a part of the housing 11. For example, the suction pad 13a may be mounted directly to the bottom surface of the housing 11.

If the electronic device 10 is placed on a floor, the suction pad 13a may be sucked onto the floor by the weight of the housing 11 and/or parts contained in the housing 11. For example, as an inner space of the suction pad 13a contracts by the weight of the housing 11 and so on and thus the inner pressure of the suction pad 13a decreases, the suction pad 13a may be sucked to the floor. As described later in relation to an embodiment disclosed in FIG. 3, even though the electronic device 10 is tilted with respect to the floor due to interference or impact from an external object, the vacuum suction device 13 may prevent the electronic device 10 from falling down. As described later in relation to an embodiment disclosed in FIG. 3, when the electronic device 10 is to be moved, the electronic device 10 may be easily removed from the floor by raising the electronic device 10 in a predetermined direction (for example, a direction perpendicular to the floor) or rotating the electronic device 10. For example, the motion of raising or rotating the electronic device 10 leads to opening of a vent hole (for example, a vent hole 111 in FIG. 7) formed in the suction pad 13a, and the internal pressure of the suction pad 13a becomes substantially equal to an ambient pressure, thereby facilitating removal of the suction pad 13a from the floor.

Figure 2:
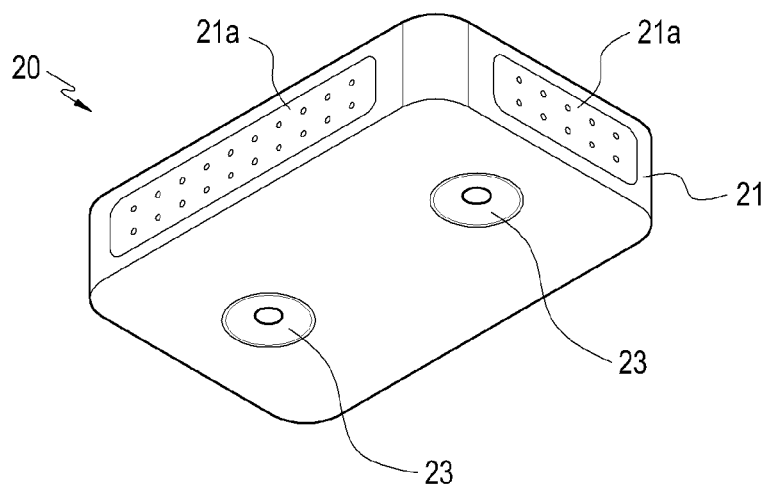
FIG. 2 illustrates a perspective view of another exemplary electronic device including a vacuum suction device according to various embodiments of the present disclosure.

FIG. 2 illustrates a perspective view of another exemplary electronic device 20 including a vacuum suction device according to various embodiments of the present disclosure.

Referring to FIG. 2, the electronic device 20 may be, for example, a Bluetooth speaker equipped with a desktop clock functionality, a wireless power transmission functionality, and a wireless frequency relay functionality. A speaker grill 21a may be mounted on a side surface of a housing 21 in the electronic device 20, and a vacuum suction device, for example, suction pads 23 may be disposed on the bottom surface of the housing 21. When the electronic device 20 is placed on a floor, the suction pad may be sucked to the floor by the weight of the housing 21 and the like, thereby stably positioning the electronic device 20. In an embodiment, a pair of suction pads 23 may be arranged on the bottom surface of the housing 21. In some embodiment, if a plurality of suction pads 23 are arranged, the electronic device 20 may be readily removed from the floor by raising the electronic device 20 in a predetermined direction.

A detailed description will be given of the above-described vacuum suction device with reference to FIG. 3.

Figure 3:
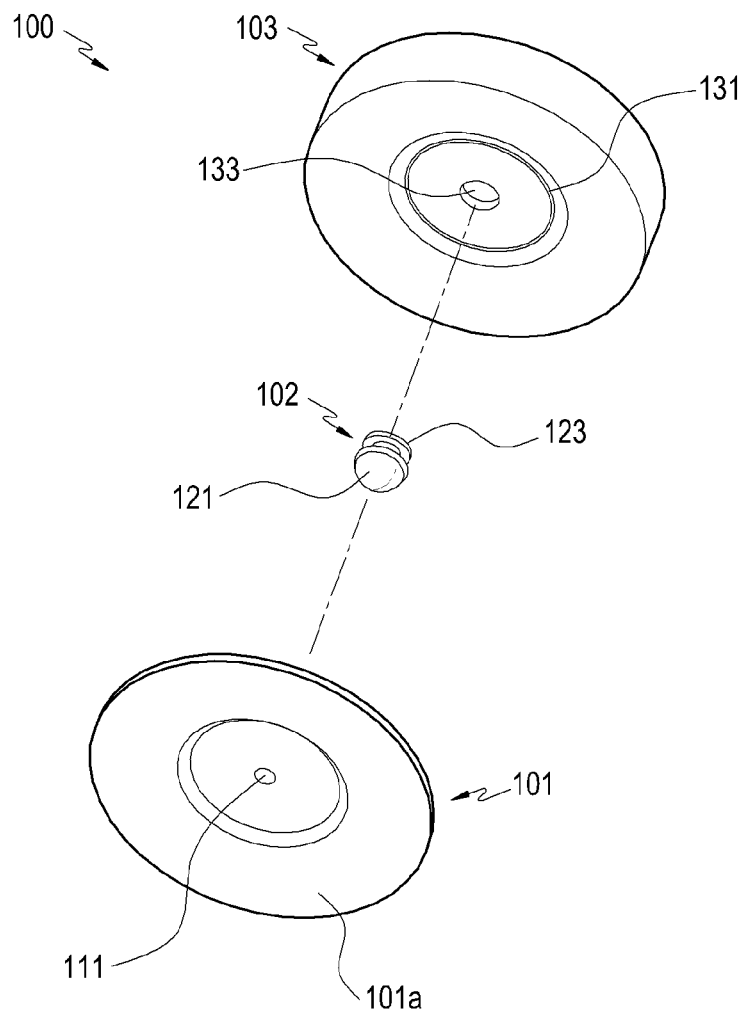
FIG. 3 illustrates an exploded perspective view of a vacuum suction device according to one of various embodiments of the present disclosure.
Figure 4:
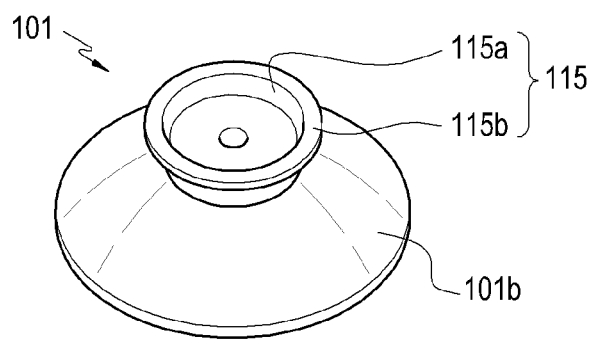
FIG. 4 illustrates a perspective view of a suction pad in a vacuum suction device according to one of various embodiments of the present disclosure.
Figure 5:
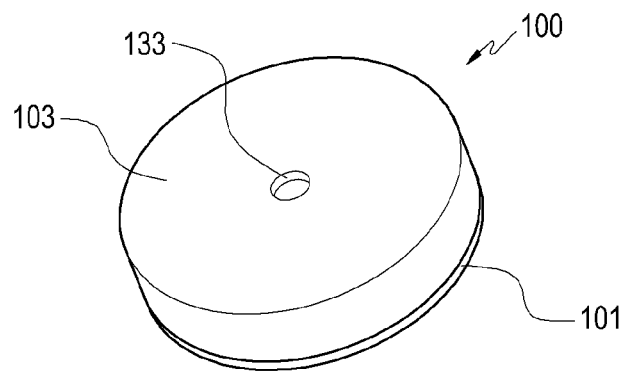
FIG. 5 illustrates an exploded perspective view of a vacuum suction device according to one of various embodiments of the present disclosure.
Figure 6:
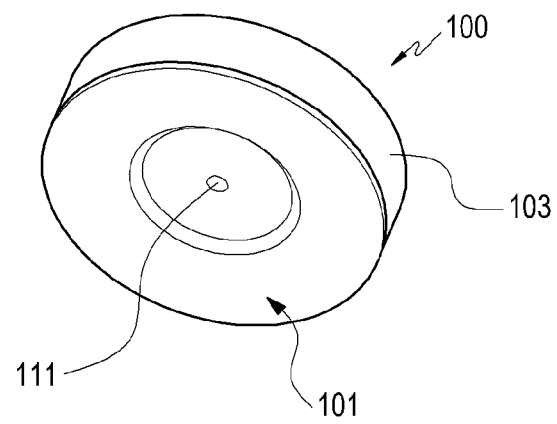
FIG. 6 illustrates a perspective view of a vacuum suction device according to one of various embodiments of the present disclosure, viewed from a different direction.

FIG. 3 illustrates an exploded perspective view of a vacuum suction device 100 according to one of various embodiments of the present disclosure, FIG. 4 illustrates a perspective view of a suction pad 101 in a vacuum suction device according to one of various embodiments of the present disclosure, FIG. 5 illustrates an exploded perspective view of the vacuum suction device 100 according to one of various embodiments of the present disclosure, and FIG. 6 illustrates is a perspective view of the vacuum suction device 100 according to one of various embodiments of the present disclosure, viewed from a different direction.

Referring to FIGS. 3 to 6, the vacuum suction device 100 may include the suction pad 101, a vent hole 111 formed in the suction pad 101, and a valve member 102 disposed on an outer surface of the suction pad 101b.

According to various embodiments, the suction pad 101 may be molded of synthetic rubber or flexible plastic into a predetermined shape, and may be deformed by external force. Without an external force, the suction pad 101 may elastically return to the original molded form. For example, the suction pad 101 is shaped so that the inner surface 101a of suction pad 101 may be concave. If an external force is exerted on an outer surface 101b of the suction pad 101, a space defined by the inner surface 101a may be contracted. With the inner surface 101a contracted, the pressure of the space defined by the inner surface 101a may be decreased due to the property of the suction pad 101 to return to the original molded form. For example, as the pressure of the inner space of the suction pad 101 decreases, the suction pad 101 may sucked to a plane (for example, a wall or a floor), facing the plane.

According to various embodiments, the vent hole 111 may penetrate from the inner surface 101a to the outer surface 101b of the suction pad 101. For example, the vent hole 111 may connect the inner space of the suction pad 101 to an outer space. The valve member 102 may selectively open or close one end portion of the vent hole 111 from the outer surface of the suction pad 101. For example, in the state where the pressure of the inner space of the suction pad 101 is low, external air may be introduced into the inner space of the suction pad 101 through the vent hole 111. Herein, as the valve member 102 is brought into close contact with the one end portion of the vent hole 111, thereby preventing introduction of air into the inner space of the suction pad 101. When air is discharged from the inner space of the suction pad 101 through the vent hole 111, the valve member 102 may be apart from the outer surface 101b of the suction pad 101. For example, when air is discharged, the valve member 102 may open the one end portion of the vent hole 111.

According to various embodiments, the vacuum suction device 100 may further include a cover member 103 (the cover member 13b in FIG. 1). In an embodiment, the cover member 103 may be a part of a housing (for example, the housing 11 in FIG. 1) of an electronic device. In another embodiment, the cover member 103 may include an accommodation recess 131 and a fixing hole 133. The accommodation recess 131 may be configured to form a closed curve, for example, a circle on the inner surface of the cover member 103, and the fixing hole 133 may be formed in an area surrounded by the accommodation recess 131.

According to various embodiments, the suction pad 101 may be movably engaged with the cover member 103. For example, a catching member 115 to be accommodated in the accommodation recess 131 may be provided on the outer surface 101b of the suction pad 101. In an embodiment, the catching member 115 may be circular in correspondence with the accommodation recess 131. In another embodiment, a plurality of catching members 115 may be arranged along a circle corresponding to the accommodation recess 131. For example, although the catching member 115 is continuously circular, a plurality of arc catching members may be arranged along a circle.

According to various embodiments, the catching member 115 may include an extension portion 115a and a flange portion 115b. The extension portion 115a may be extended from the outer surface 101b of the suction pad 101, and may include the flange portion 115b curved from an end portion of the extension portion 115a, while being tilted with respect to the extension portion 115a. In an embodiment, the extension portion 115a and the flange portion 115b may be perpendicular to each other.

According to various embodiments, as a part of the extension portion 115a and the flange portion 115b are accommodated in the accommodation recess 131, the suction pad 101 may be engaged with the cover member 103. As described later with reference to FIG. 7, since the inner space of the accommodation recess 131 is formed to be large enough, a part of the extension portion 115a and/or the flange portion 115b is movable to some extent inside the accommodation recess 131. For example, the cover member 103 may move within a predetermined range relative to the suction pad 101.

In some embodiment, the valve member 102 may be engaged in the fixing hole 133. For example, the valve member 102 may include a curved portion 121 corresponding to one end portion of the vent hole 111 and a fixing portion 123 extended from the curved portion 121, and the fixing portion 123 may be engaged in the fixing hole 133. When the fixing portion 123 is engaged in the fixing hole 133, the curved portion 121 may be disposed protruded from the inner surface of the cover member 103.

Figure 7:
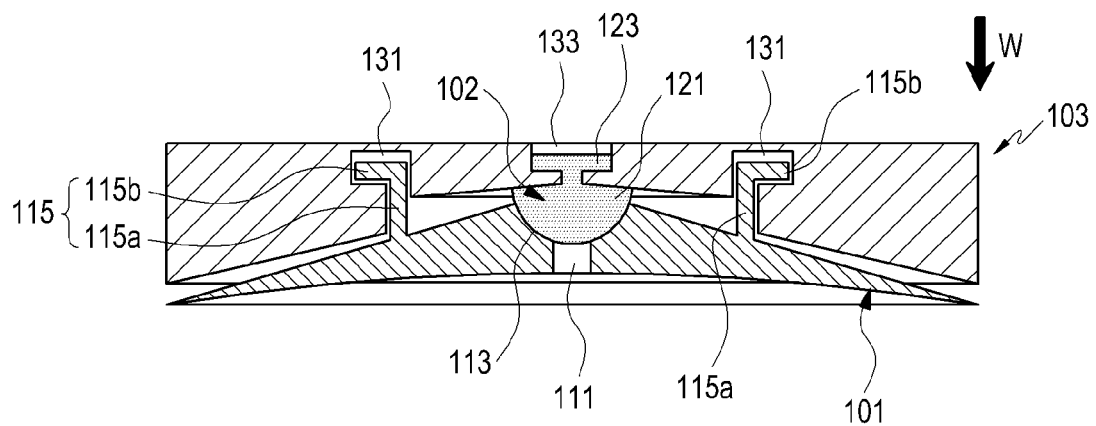
FIG. 7 illustrates a sectional view of a vacuum suction device according to one of various embodiments of the present disclosure.
Figure 8:
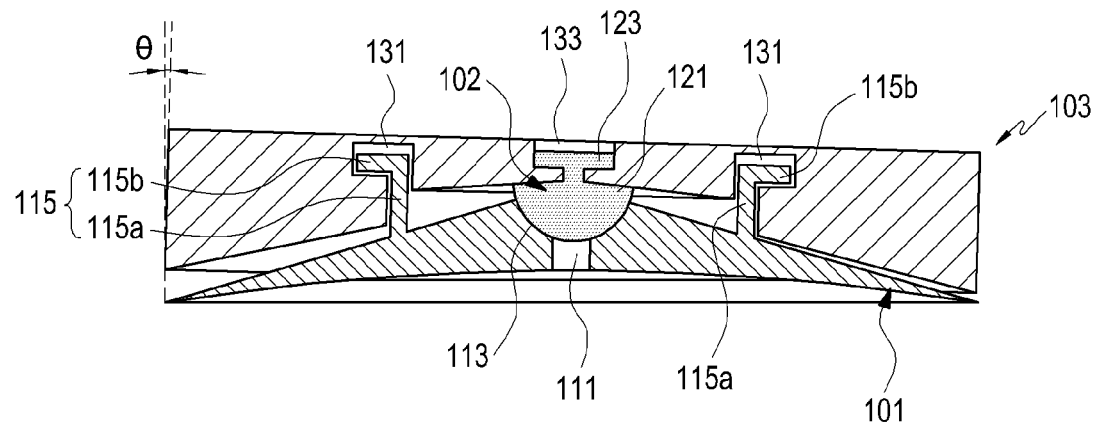
FIGS. 8 and 9 illustrate sectional views of a use example of a vacuum suction device according to one of various embodiments of the present disclosure.
Figure 9:
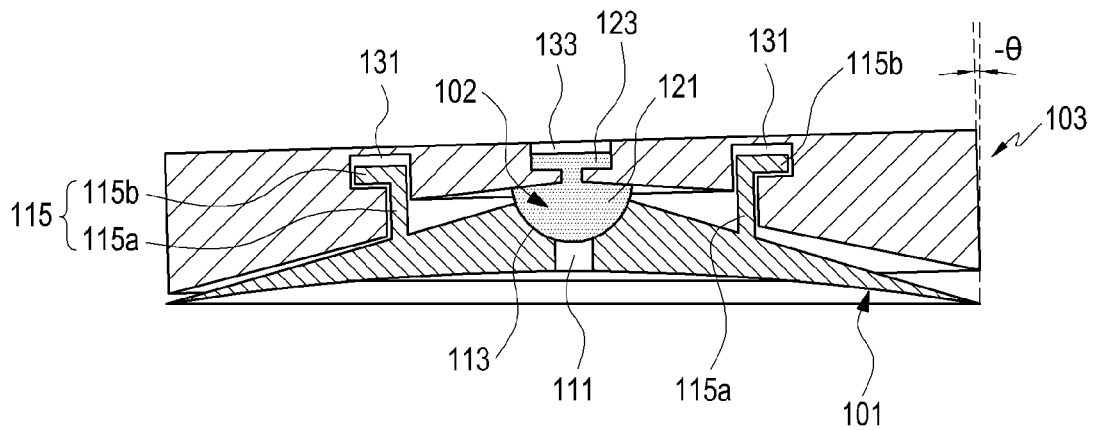

FIG. 7 illustrates a sectional view of the vacuum suction device 100 according to one of various embodiments of the present disclosure, and FIGS. 8 and 9 illustrate sectional views of a use example of the vacuum suction device 100 according to one of various embodiments of the present disclosure.

Referring to FIGS. 7, 8 and 9, the vacuum suction device 100 may further include a mounting recess 113 formed on the outer surface of the suction pad 101. The mounting recess 113 is shaped to be sunk from the outer surface of the suction pad 101. For example, as the valve member 102 (for example, the curved portion 121) is brought into close contact with the mounting recess 113, the vent hole 111 may be closed. In an embodiment, the mounting recess 113 may be curved with a predetermined curvature. For example, the mounting recess 113 may be a part of a spherical surface.

In an embodiment, the outer circumferential surface of the valve member 102, for example, the outer circumferential surface of the curved portion 121 may be shaped at least partially in correspondence with the shape of the inner circumferential surface of the mounting recess 113. In an embodiment, with the vent hole 111 closed by the valve member 102, a part of the outer circumferential surface of the valve member 102, for example, a part of the outer circumferential surface of the curved portion 121, corresponding to the inner circumferential surface of the mounting recess 113 may be exposed outward from the mounting recess 113. For example, even though the curved portion 121 rotates or rolls inside the mounting recess 113, in close contact with the mounting recess 113, the whole inner circumferential surface of the mounting recess 113 may closely contact a part of the outer circumferential surface of the curved portion 121. For example, as the valve member 102 slidingly contacts the inner circumferential surface of the mounting recess 113, while the outer surface of the valve member 102 (or the curved portion 121) and/or a part of the outer surface of the valve member 102 (or the curved portion 121) is kept in close contact with the mounting recess 113, the valve member 102 may rotate with respect to the suction pad 101. In some embodiment, if the valve member 102 rotates with respect to the suction pad 101 in the state where the suction pad 101 is fixed on a plane, the cover member 103 may also move within a predetermined range relative to the suction pad 101. For example, as illustrated in FIGS. 8 and 9, the cover member 103 may move within an angle range of +−θ with respect to a plane.

According to various embodiments, if the vacuum suction device 100 is provided in an electronic device (for example, the electronic device 10 in FIG. 1), the suction pad 101 may be sucked to a plane (for example, a floor) by the weight of the electronic device 10 and/or the housing 11. In some embodiment, the cover member 103 may be mounted to the housing 11 or may be a part of the housing 11. For example, with the suction pad 101 sucked to a plane, the electronic device may move together with the cover member 103 within a predetermined range relative to the suction pad 101 and/or the plane, while being kept stably cradled on the plane. Thus, the electronic device including the vacuum suction device 100 may be kept positioned stably without falling down by interference or impact from another object.

If the user wants to move an electronic device (for example, the electronic device 10 in FIG. 1) including the vacuum suction device 100, the user may raise the electronic device 10 in a predetermined direction, for example, in a direction perpendicular to the plane to which the suction pad is sucked, thereby readily removing the suction pad 101 from the plane. For example, if the electronic device with the vacuum suction device 100 is raised up, the cover member 103 recedes away from the suction pad 101, along with the valve member 102. As a result, the outer circumferential surface of the valve member 102 (for example, the curved portion 121) becomes apart from the inner circumferential surface of the mounting recess 113, and thus air may be introduced into the suction pad 101. Therefore, the inner pressure of the suction pad 101 becomes substantially equal to an ambient pressure, and the suction pad 101 loses a suction force, so that the user may easily remove and move the electronic device from the plane.

Figure 10:
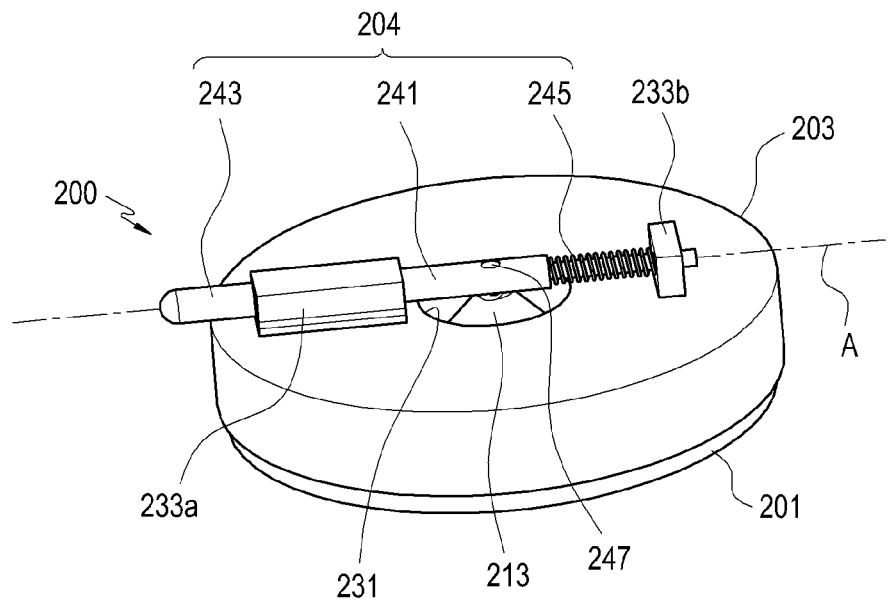
FIG. 10 illustrates a perspective view of a vacuum suction device according to one of various embodiments of the present disclosure.

FIG. 10 illustrates a perspective view of a vacuum suction device 200 according to one of various embodiments of the present disclosure.

Referring to FIG. 10, the vacuum suction device 200 may include a suction pad 201, a first vent hole (211 in FIG. 11) formed in the suction pad 201, a valve member 204 rotatably engaged on the suction pad 201, and/or a second vent hole 247 formed in the valve member 204. The valve member 204 may include a rotation rod 241 that rotates in close contact between a part of the outer circumferential surface of the rotation rod 241 and the outer surface of the suction pad 201. While the valve member 204 (for example, the rotation rod 241) is rotating, the second vent hole 247 may be selectively aligned with the first vent hole 211. Thus, external air may be introduced into the suction pad 201. In some embodiment, the vacuum suction device 200 may further include a cover member 203 engaged with the suction pad 201, surrounding at least a part of the outer surface of the suction pad 201, and the valve member 204 may be mounted on the cover member 203.

According to various embodiments, the suction pad 201 has a concave inner surface, and may be sucked to a plane, with the inner surface of the suction pad 201 facing the plane. For example, if with the inner surface of the suction pad 201 facing the plane, an external surface is applied to the outer surface of the suction pad 201, an inner space of the suction pad 201 (for example, a space formed by the inner surface of the suction pad 201) is contracted. If the external force is removed, the inner pressure of the suction pad 201 is decreased due to the property of the suction pad 201 to return to the original molded form of the suction pad 201, thereby keeping the suction pad 201 sucked to the plane.

Figure 11:
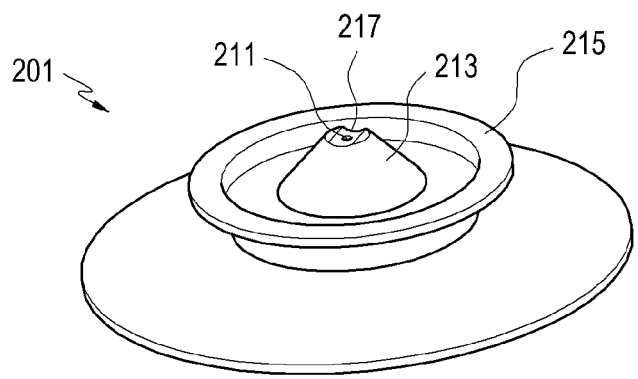
FIG. 11 illustrates a perspective view of a suction pad in a vacuum suction device according to another of various embodiments of the present disclosure.

FIG. 11 illustrates a perspective view of the suction pad 201 in a vacuum suction device according to another of various embodiments of the present disclosure.

Referring to FIG. 11, similarly to the suction pad 101 illustrated in FIG. 4, the suction pad 201 includes a catching member 215. Thus, the suction pad 201 may be engaged with the cover member 203, and a part of the suction pad 201 may be exposed from the outer surface of the cover member 203 through an opening 231 formed on the cover member 203. For example, the suction pad 201 may include a protrusion 213 formed on the outer surface of the suction pad 201. If the suction pad 201 is engaged with the cover member 203, the protrusion 213 may be exposed from the outer surface of the cover member 203 through the opening 231.

The protrusion 213 is shaped into a cone protruded from the outer surface of the suction pad 201, and one end portion of the first vent hole 211 may be exposed from one end portion, for example, a top end portion of the protrusion 213. For example, the first vent hole 211 penetrates from the inner surface of the suction pad 201 through the outer surface of the suction pad 201, and one end portion of the first vent hole 211 may be opened on the top end of the protrusion 213. In some embodiment, the suction pad 201 may include a mounting recess 217 formed on the top end of the protrusion 213. The mounting recess 217 is curved in correspondence with a part of the outer circumferential surface of the valve member 204, for example, the rotation rod 241. The mounting recess 217 may slidingly contact the outer circumferential surface of the valve member 204 in close contact with a part of the outer circumferential surface of the valve member 204. In another embodiment, one end portion of the first vent hole 211 may be positioned on the mounting recess 217.

Referring to FIG. 10 again, the rotation rod 241 of the valve member 204 may be disposed in close contact with the inner circumferential surface of the mounting recess 217, for example, one end portion of the first vent hole 211 from the outer surface of the suction pad 201. The second vent hole 247 may penetrate in a direction crossing the length direction of the rotation rod 241. The rotation rod 241 may be installed rotatably with respect to a rotation axis extended along the length direction of the rotation rod 241 on the outer surface of the cover member 203. Along with the rotation of the rotation rod 241, the second vent hole 247 may be selectively connected to the first vent hole 211. For example, the inner space of the suction pad 201 may be connected to an outer space through the first vent hole 211 and the second vent hole 247.

According to various embodiments, the rotation rod 241 may rotate with respect to the cover member 203, in engagement with a holder(s) 233a and 233b formed on the outer circumferential surface of the cover member 203. The holder(s) 233a and 233b may support both ends of the rotation rod 241 in a manner that allows rotation of the rotation rod 241. In an embodiment, when seen from a plan view, the rotation rod 241 may be arranged in a diameter direction of the suction pad 201, and a part of the outer circumferential surface of the rotation rod 241 may closely contact the top end of the protrusion 213. In some embodiment, the suction pad 201 may sucked to a plane by a force that presses down the cover member 203. Herein, the rotation rod 241 may be brought into closer contact with the top end of the protrusion 213.

Figure 12:
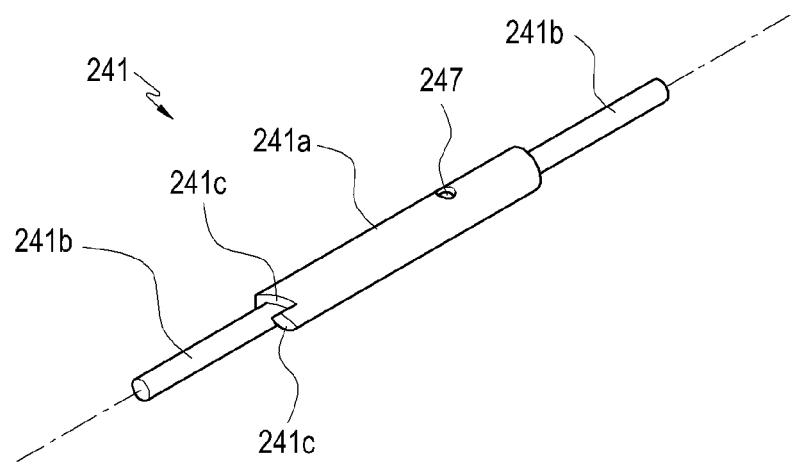
FIG. 12 illustrates a perspective view of a rotation rod in a vacuum suction device according to another of various embodiments of the present disclosure.
Figure 13:
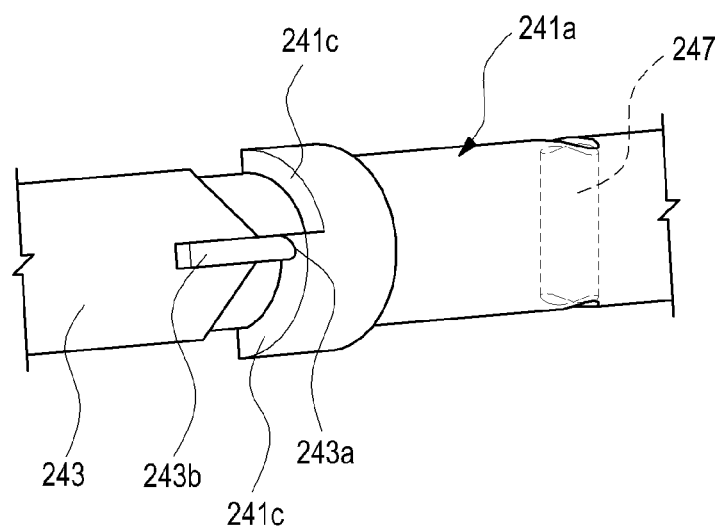
FIG. 13 illustrates a view of an operation of a valve member in a vacuum suction device according to another of various embodiments of the present disclosure.
Figure 14:
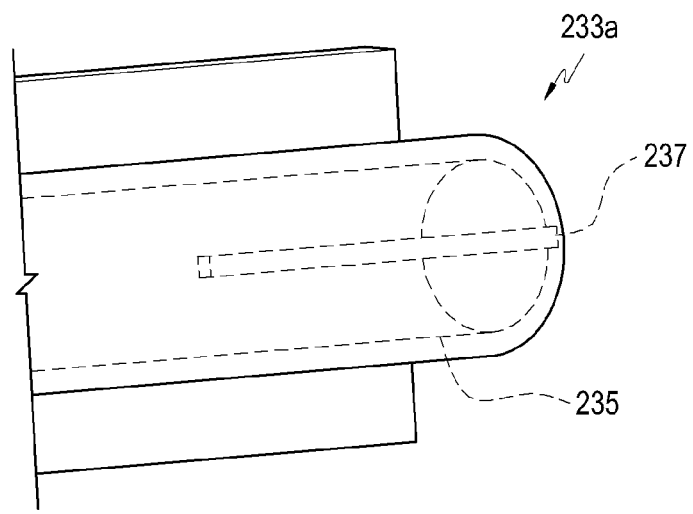
FIG. 14 illustrates a view of a holder in a vacuum suction device according to another of various embodiments of the present disclosure.

FIG. 12 illustrates a perspective view of the rotation rod 241 in a vacuum suction device according to another of various embodiments of the present disclosure, FIG. 13 illustrates a view of an operation of a valve member in a vacuum suction device according to another of various embodiments of the present disclosure, and FIG. 14 illustrates a view of a holder in a vacuum suction device according to another of various embodiments of the present disclosure.

Referring to FIG. 12, the rotation rod 241 may include a valve portion 241a extended along the rotation axis A, and supports 241b extended from both ends of the valve portion 241a along the rotation axis A. The second vent hole 247 may penetrate through the valve protion 241a in the rotation rod 241. Each of the supports 241b may be rotatably supported by one of the afore-described holder(s) 233a and 233b.

Referring to FIGS. 12, 13, and 14 together with FIG. 10, the valve member 204 may further include a cam button 243 and an elastic member 245.

According to various embodiments, the cam button 243 may be disposed such that the cam button 243 may make a linear reciprocating motion on the outer surface of the suction pad 201. The cam button 243 may include a first inclined cam surface 243a at an end thereof. In an embodiment, a second inclined cam surface 241c interworking with the first inclined cam surface 243a may be formed at one end portion of the valve portion 241a. For example, when the cam button 243 makes a linear reciprocating movement, the first inclined cam surface 243a may be interfered by the second inclined cam surface 241c, thereby rotating the rotation rod 241. In some embodiment, if the cam button 243 makes one reciprocating movement in a reciprocating range, the rotation rod 241 may rotate by 90 degrees. For example, if with the second vent hole 247 aligned with the first vent hole 211, the cam button 243 makes one reciprocating movement, the second vent hole 247 may be aligned vertically with the first vent hole 211.

The cam button 243 may be installed such to make a linear reciprocating movement inside the first holder 133a. For example, the first holder 233a may include an operation hole 235 for accommodating the cam button 243, and a guide slot 237 formed in the operation hole 235. The guide slot 237 may be extended in parallel to the length direction of the rotation rod 241 and/or the reciprocating direction of the cam button 243. A guide protrusion 243b corresponding to the guide slot 237 may be formed on the outer circumferential surface of the cam button 243. For example, as the guide protrusion 243b is accommodated in the guide slot 237, the cam button 243 may be accommodated in the operation hole 235 in a state where the cam button 243 is capable of making a linear movement but is limited in rotation. With the cam button 243 accommodated in the operation hole 235, one end portion of the cam button 243 may protrude outward from the cover member 203. For example, the user may reciprocate the cam button 243 by pressing the cam button 243, as indicated by reference character P, and along with linear movement of the cam button 243, the first inclined cam surface 243a and the second inclined cam surface 241c are interfered, thereby rotating the rotation rod 241, as indicated by reference numeral R.

Referring to FIG. 10 again, the elastic member 245 has one end supported by the second holder 233b and the other end supported by the other end portion of the rotation rod 241, for example, the valve portion 241a, and thus may return the cam button to an initial position (the position of the cam button 243 prior to being pressed by the user). For example, if an external force is not applied to the cam button 243, the cam button 243 may be kept protruded outward from the cover member 203 by an elastic force of the elastic member 245.

Figure 15:
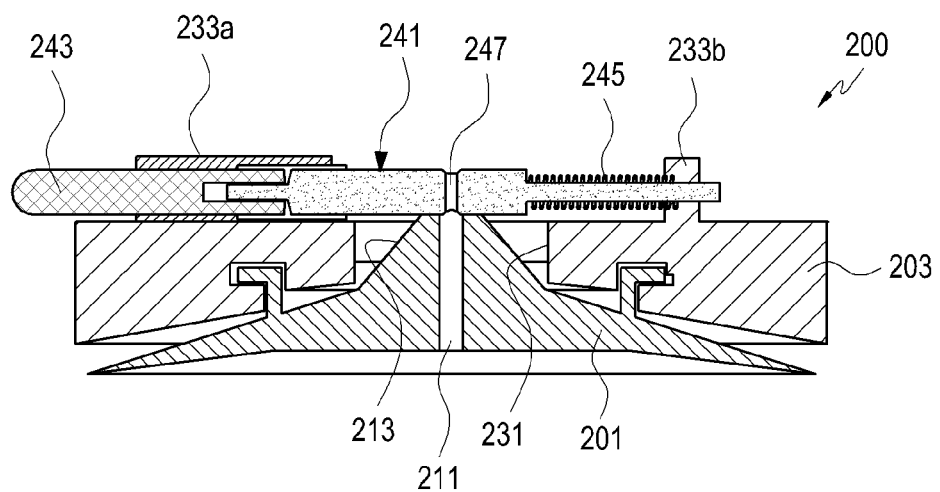
FIGS. 15 and 16 illustrate sectional views of a use example of a vacuum suction device according to another of various embodiments of the present disclosure.
Figure 16:
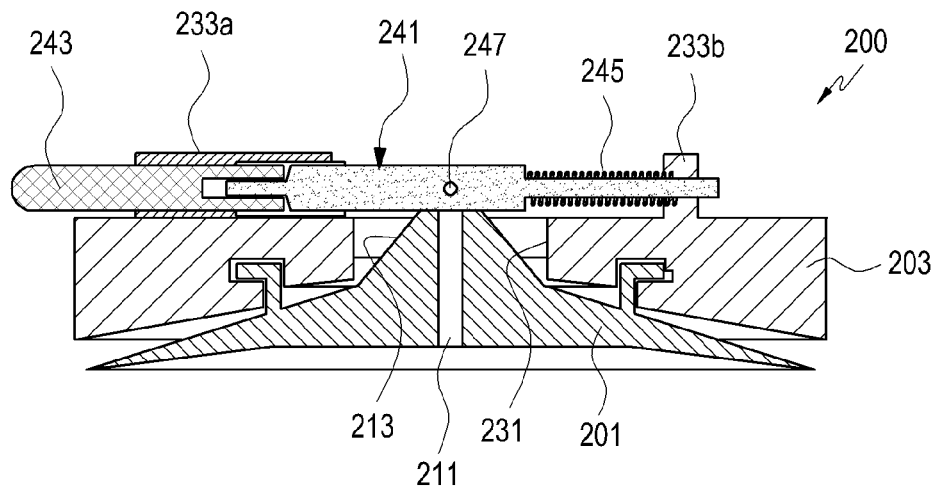

FIGS. 15 and 16 illustrate sectional views of a use example of the vacuum suction device 200 according to another of various embodiments of the present disclosure.

Referring to FIGS. 15 and 16, with the first vent hole 211 closed, for example, with one end portion of the first vent hole 211 facing the outer circumferential surface of the rotation rod 241, the vacuum suction device 200 may be isolated from an outer surface which is the inner surface of the suction pad 201. If with the inner space of the suction pad 201 isolated, an external force is applied (for example, the electronic device 10 is disposed on a plane and the weight of the housing 11 and so on is applied), the cover member 203 may press down the suction pad 201, thereby reducing the inner space of the suction pad 201. In some embodiment, the cover member 203 may be a part of the afore-described housing of the electronic device. If the inner space of the suction pad 201 is reduced, the inner pressure of the suction pad 201 may increase, thus discharging air to the outside. Herein, the air inside the suction pad 201 may be discharged through a part of the edge of the suction pad 201 and/or between the inner circumferential surface of the mounting recess 217 and the outer circumferential surface of the rotation rod 241 through the first vent hole 211. Along with the discharge of the air inside the suction pad to the outside, the internal pressure of the suction pad 201 may be decreased due to the property of the suction pad 201 to returning to its original molded form (for example, elastic restoring force). If the internal pressure of the suction pad 201 is decreased, the outer circumferential surface of the rotation rod 241 may be brought into close contact with the mounting recess 217, and the suction pad 201 may be kept sucked to the plane.

According to various embodiments, if the user wants to move the electronic device provided with the vacuum suction device 200, the user may easily remove the suction pad 201 from the plane by pressing the cam button 243. For example, if the cam button 243 is pressed, the rotation rod 241 rotates by a predetermined angle (for example, 90 degrees). Thus, the second vent hole 247 is connected to the first vent hole 211, thereby introducing external air into the suction pad 201. As a consequence, the suction force of the suction pad 201 is eliminated and the user may readily move the electronic device.

Figure 17:
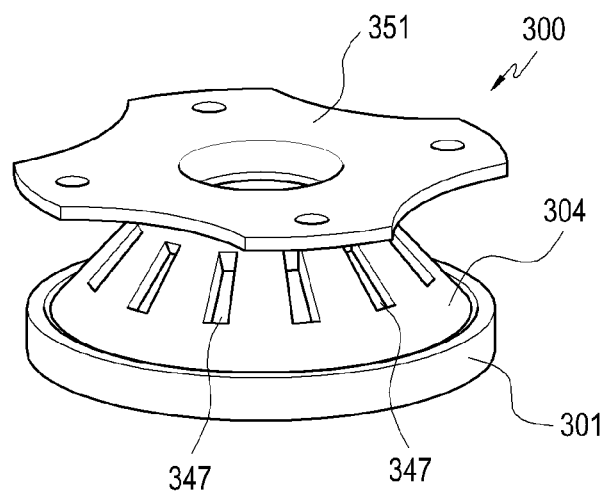
FIG. 17 illustrates a perspective view of a closed vent hole in a vacuum suction device according to another of various embodiments of the present disclosure.
Figure 18:
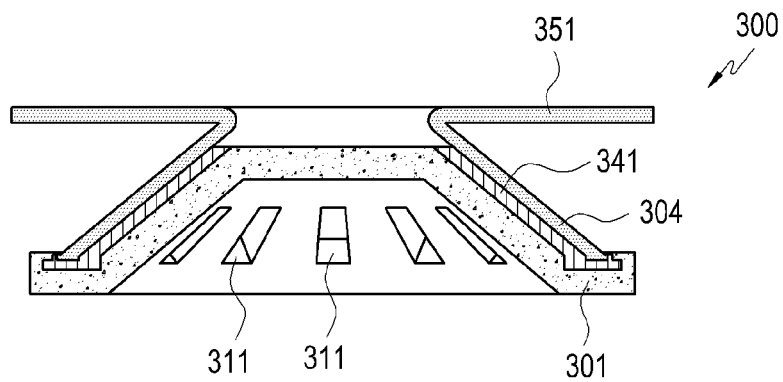
FIG. 18 illustrates a sectional view of a closed vent hole in a vacuum suction device according to another of various embodiments of the present disclosure.

FIG. 17 illustrates a perspective view of a closed vent hole in a vacuum suction device 300 according to another of various embodiments of the present disclosure, and FIG. 18 illustrates a sectional view of a closed vent hole in the vacuum suction device 300 according to another of various embodiments of the present disclosure.

Referring to FIGS. 17 and 18, the vacuum suction device 300 may include a suction pad 301, and a valve member 304 rotatably engaged with the outer circumferential surface of the suction pad 301. According to an embodiment, at least one first vent hole(s) 311 is formed in the suction pad 301, and at least one second vent hole 347 is formed in the valve member 304. As the valve member 304 rotates, the second vent hole 347 may be aligned with the first vent hole(s) 311.

The suction pad 301 may be molded of synthetic rubber or flexible plastic, the inner surface of which is concave. The inner space of the suction pad 301 may be contacted by an external force. The first vent hole(s) 311 may penetrate from the inner surface of the suction pad 301 to the outer surface of the suction pad 301. According to an embodiment, a plurality of first vent holes(s) 311 may be arranged along the circumferential direction of the suction pad 301, each first vent hole(s) 311 being extended in a radius direction of the suction pad 301.

The valve member 304 is shaped to surround at least part of the outer surface of the suction pad 301. With the edge of the valve member 304 surrounded by the suction pad 301, the valve member 304 may rotate with respect to the suction pad 301, facing the suction pad 301. An engagement member 351 may be provided on a top end of the valve member 304. The engagement member 351 may be mounted, for example, on the bottom surface of a housing (for example, the housing 11 in FIG. 1) of the electronic device. In some embodiment, the engagement member 351 may be a part of the housing of the electronic device. The valve member 304 may further include an intermediate member 341 provided on the inner surface of the valve member 304. The intermediate member 341 may be fabricated of synthetic rubber or flexible plastic, and may closely contact with the outer surface of the suction pad 301. For example, as the intermediate member 341 closes the first vent hole(s) 311, the inner space of the suction pad 301 may be isolated from an outer space.

According to various embodiments, the second vent hole 347 may be aligned selectively with the first vent hole(s) 311 along with the rotation of the valve member 304. For example, as the valve member 304 rotates, the first vent hole(s) 311 may be opened or closed. In some embodiment, a plurality of second vent holes 347 may be arranged along a circumferential direction of the valve member 304, each second vent hole 347 being extended in a radius direction of the valve member 304.

According to various embodiments, if an external force is applied (for example, the weight of the above-described electronic device is applied) in the state where the suction pad 301 is placed facing a plane and the first vent hole(s) 311 is closed, the inner space of the suction pad 301 is contacted, thereby discharging internal air through a part of the edge of the suction pad 301 and/or a space between the outer surface of the suction pad 301 and the inner surface of the valve member 304 (for example, the inner surface of the intermediate member 341). With the internal air discharged, the elastic restoring force of the suction pad 301 decreases the internal pressure of the suction pad 301. As a result, the suction pad 301 may be sucked to the plane. If the internal pressure of the suction pad 301 decreases in the state where the intermediate member 301 has closed the first vent hole(s) 311, the intermediate member 341 may be brought into closer contact with the outer surface of the suction pad 301. For example, since external air may not be introduced into the suction pad 301, the suction force of the suction pad 301 may be kept constant.

Figure 19:
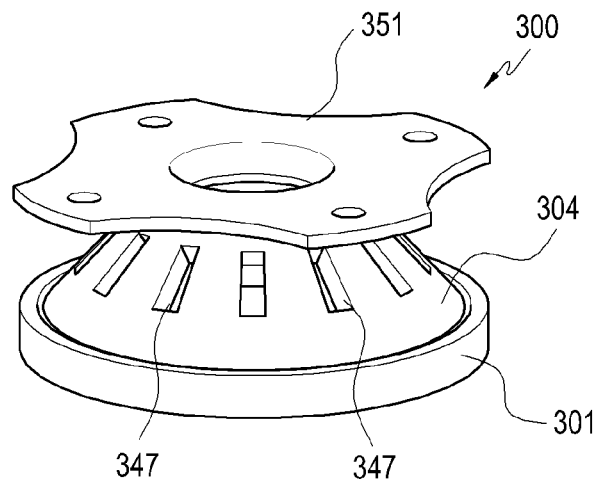
FIG. 19 illustrates a perspective view of an opened vent hole in a vacuum suction device according to another of various embodiments of the present disclosure.
Figure 20:
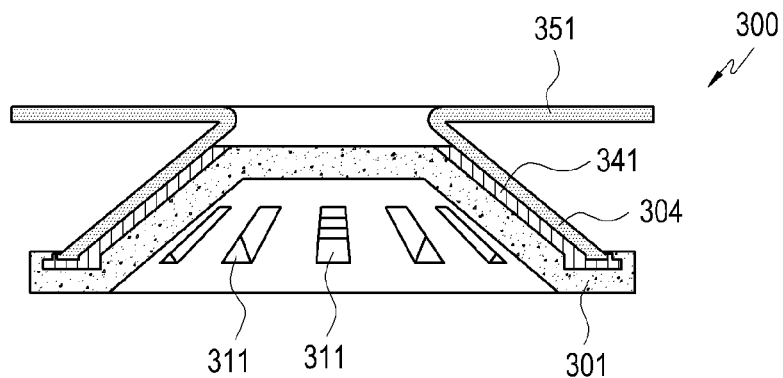
FIG. 20 illustrates a sectional view of an opened vent hole in a vacuum suction device according to another of various embodiments of the present disclosure.

FIG. 19 illustrates a perspective view of an opened vent hole in the vacuum suction device 300 according to another of various embodiments of the present disclosure, and FIG. 20 illustrates a sectional view of an opened vent hole in the vacuum suction device 300 according to another of various embodiments of the present disclosure.

Referring to FIGS. 19 and 20, as the valve member 304 rotates, the second vent holes 347 are aligned respectively with the first vent hole(s) 311, thereby allowing air to be introduced into the suction pad 301. For example, as the suction force of the suction pad 301 is eliminated, the suction pad 301 may be readily removed from a plane. According to various embodiments, if an electronic device provided with the vacuum suction device 300 is placed with the first vent hole(s) 311 closed, the suction pad 301 may be sucked to the plane by the weight of the electronic device (or a housing of the electronic device). To move the electronic device placed on the plane, the user may easily raise up the electronic device from the plane by rotating the electronic device by a predetermined angle. For example, since the engagement member 351 is mounted in the housing of the electronic device, rotation of the electronic device may lead to rotation of the valve member 304, thereby introducing external air into the suction pad 301. As the external air is introduced into the suction pad 301, the suction force of the suction pad 301 is eliminated. Thus, the user may easily remove the electronic device, for example, the suction pad 301 from the plane.

Figure 21:
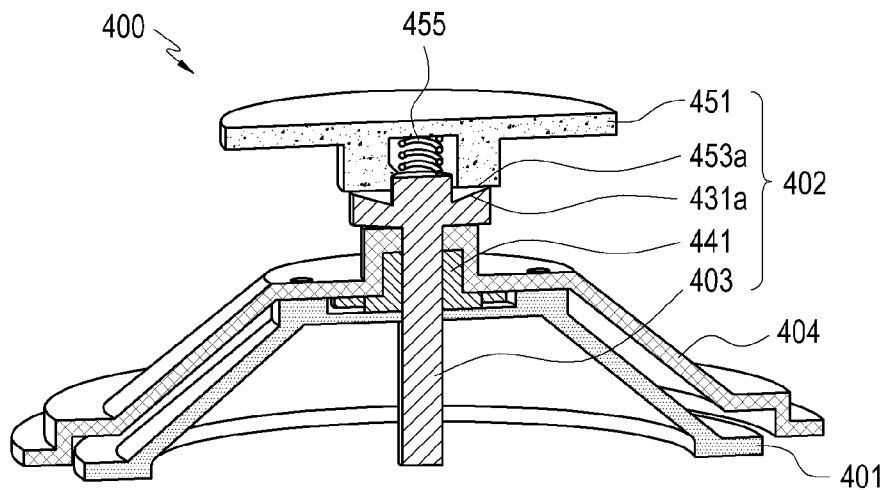
FIG. 21 illustrates a perspective, partially cut-away view of a vacuum suction device according to another of various embodiments of the present disclosure.
Figure 22:
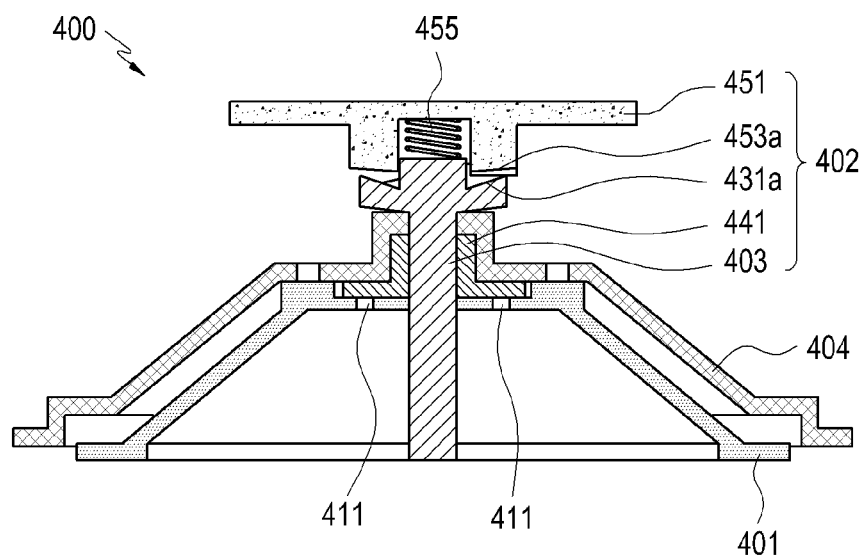
FIG. 22 illustrates a sectional view of a vacuum suction device according to another of various embodiments of the present disclosure.

FIG. 21 illustrates a perspective, partially cut-away view of a vacuum suction device 400 according to another of various embodiments of the present disclosure, and FIG. 22 illustrates a sectional view of the vacuum suction device 400 according to another of various embodiments of the present disclosure.

Referring to FIGS. 21 and 22, the vacuum suction device 400 may include a suction pad 401 and a valve member 402. As a part (for example, a valve plate 441) of the valve member 402 rotates on the suction pad 401, at least one first vent hole(s) 411 formed in the suction pad 401 may be opened or closed. According to an embodiment, the vacuum suction device 400 may include a cover member 404. The cover member 404 is engaged with the suction pad 401, surrounding at least a part of the outer circumferential surface of the suction pad 401, and may constrain a part (for example, the valve plate 441) of the valve member 402, rotatably on the outer surface of the suction pad 401.

The suction pad 401 has a concave inner surface, and a space formed by the inner surface of the suction pad 401 may be contracted by an external force. If the external force is not applied, the suction pad 401 may return to its original molded form. The suction pad 401 may include the at least one first vent hole(s) 411 penetrating from the inner surface of the suction pad 401 to the outer surface of the suction pad 401. If there are a plurality of first vent hole(s) 411, the first vent hole(s) 411 may be arranged at a predetermined angle interval along a circumferential direction of the suction pad 401.

According to various embodiments, the valve member 402 may include the valve plate 441, a rotary shaft member 403, and a cam member 451.

Figure 23:
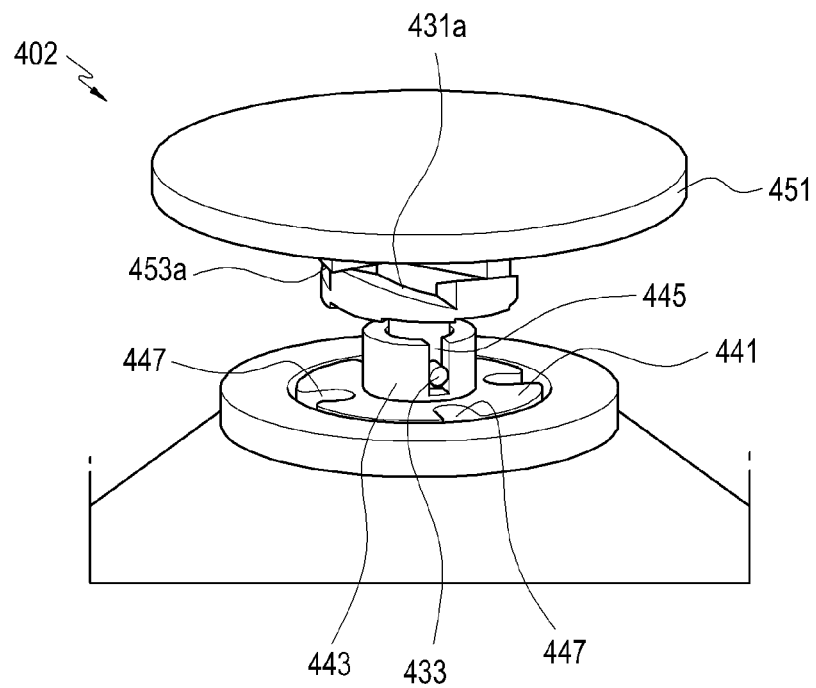
FIG. 23 illustrates a view of the structure of a valve member in a vacuum suction device according to another of various embodiments of the present disclosure.

FIG. 23 illustrates a view of the structure of the valve member in the vacuum suction device 400 according to another of various embodiments of the present disclosure.

Referring to FIG. 23, the valve plate 441 may include a second vent hole(s) 447, a guide rib 443, and a guide hole 445. The valve plate 441 is disposed rotatably, one surface of which faces the outer surface of the suction pad 401. Along with the rotation of the valve plate 441, the second vent hole(s) 447 are aligned with the first vent hole(s) 411, thus connecting the inner space of the suction pad 401 to the outer space. The guide rib 443 may be shaped into a cylinder, extended from the other surface of the valve plate 441. The guide hole 445 may be formed in the guide rib 443.

The rotary shaft member 403 may be engaged, penetrating through the suction pad 401 and the valve plate 441, and may move up and down with respect to the suction pad 401 and/or the valve plate 441. According to an embodiment, the rotary shaft member 403 may include a guide protrusion 433 formed on the outer circumferential surface thereof. When the rotary shaft member 403 is engaged with the suction pad 401 (and/or the valve plate 441), the guide protrusion 433 may be accommodated in the guide hole 445. When the rotary shaft member 403 moves up and down with respect to the suction pad 401 and/or the valve plate 441, the guide protrusion 433 may move along the guide hole 445. For example, the guide hole 445 may be extended along a vertical movement direction of the rotary shaft member 403. As mentioned before, since the valve plate 441 is engaged rotatably with the suction pad 401, and the guide hole 445 and the guide protrusion 433 are engaged with each other, the rotary shaft member 403 may rotate together with the valve plate 441 with respect to the suction pad 401.

The cam member 451 may include inclined cam surfaces 453*a* facing one end portion of the rotary shaft member 403. When the rotary shaft member 403 moves up and down, the inclined cam surfaces 453*a* may be interfered by one end portion (for example, a top end portion) of the rotary shaft member 403, thereby rotating the rotary shaft member 403. For example, other inclined cam surfaces 431*a* corresponding to the inclined cam surfaces 453*a* may be formed at one end portion of the rotary shaft member 403.

Referring to FIG. 22 again, a spring 455 may be provided between the cam member 451 and the rotary shaft member 403. The spring 455 may maintain the inclined cam surfaces 453*a* and 431*a* formed respectively on the cam member 451 and the rotary shaft member 403 apart from each other.

In the foregoing embodiment, while it has been described that 'the rotary shaft member moves up and down', a part of the suction pad 401, the valve plate 441, and/or the cam member 451 may move up and down with respect to the rotation axis member 403, substantially in an environment in which the vacuum suction device 400 is actually used. For example, in the state where the vacuum suction device 400 is placed on a plane, a bottom end of the rotary shaft member 403 is supported by the plane, and the part of the suction pad 401, the valve plate 441, and/or the cam member 451 may move up and down with respect to the rotation shaft member 403.

The above vertical movement will be described in greater detail with reference to FIGS. 24 and 25.

Figure 24:
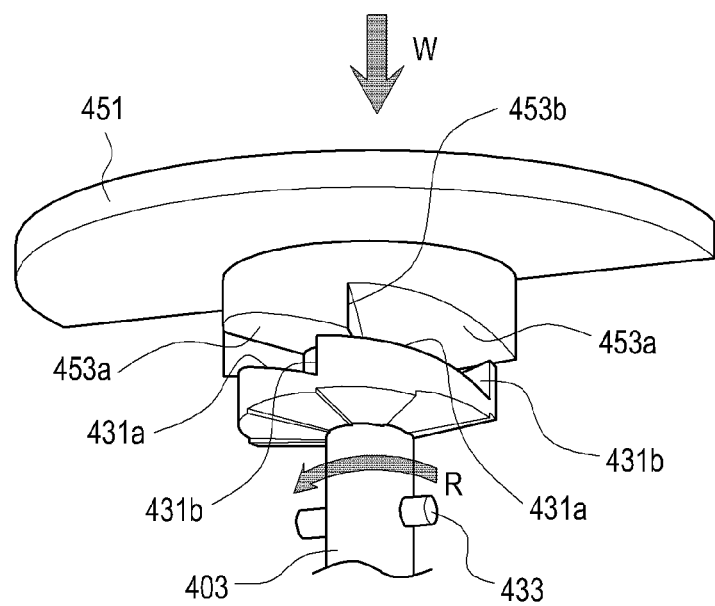
FIGS. 24 and 25 illustrate views of an operation of a valve member in a vacuum suction device according to another of various embodiments of the present disclosure.
Figure 25:
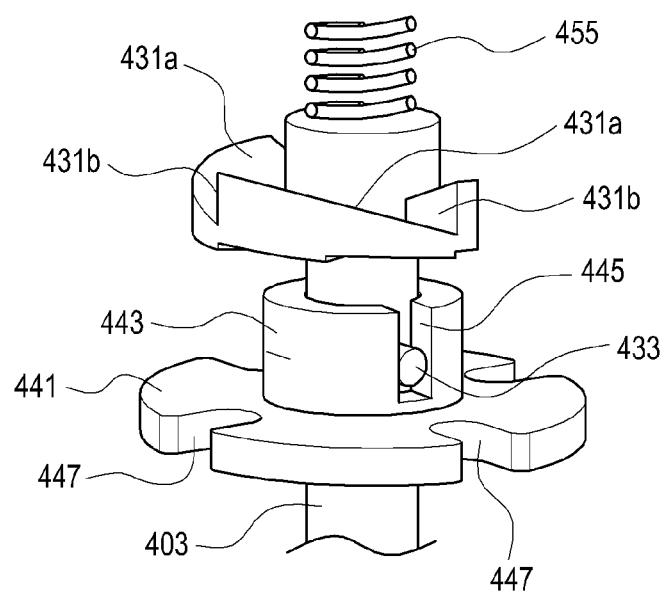

FIGS. 24 and 25 illustrate views of an operation of a valve member in a vacuum suction device according to another of various embodiments of the present disclosure.

Referring to FIGS. 24 and 25, when the vacuum suction device 400 is placed on a plane, the edge of the suction pad 401 may closely contact the plane, and the bottom end portion of the rotary shaft member 403 may also contact the plane. If an external force is applied to the vacuum suction device 400 placed on the plane, for example, if the weight W of the above-described electronic device is applied to the suction pad 401 and/or the cam member 451, a part of the suction pad 401 or the cam member 451 may move down with respect to the rotary shaft member 403. For example, the rotary shaft member 403 may rise relatively, approaching the cam member 451. As the rotary shaft member 403 approaches the cam member 451 (for example, as the cam member 451 descends), the inclined cam surfaces 431*a* of the rotary shaft member 403 may be interfered with the inclined cam surfaces 453*a* of the cam member 451, thereby rotating the rotary shaft member 403 in a first direction R. While the cam member 451 is descending, the suction pad 401 has a gradually contracted inner space, in close contact with the plane. Since the suction pad 401 is not capable of rotating, as the edge of the suction pad 401 closely contacts the plane, if the inclined cam surfaces 453*a* and 431*a* interfere with each other, the rotary shaft member 403 may rotate in the first direction R. The rotation of the rotary shaft member 403 may lead to rotation of the valve plate 441 together with the rotary shaft member 403 with respect to the suction pad 401, thereby closing the first vent hole(s) 411. Even though the first vent hole(s) 411 are closed, air inside the suction pad 401 may be discharged through a part of the edge of the suction pad 401, and/or between the outer surface of the suction pad 401 and one surface of the valve plate 441, while the inner space of the suction pad 401 is being contracted. For example, if an external force is applied to the vacuum suction device 400, the cam member 451 rotates the rotary shaft member 403, and the valve plate 441 rotates along with the rotary shaft member 403, thereby closing the first vent hole(s) 411. As the external force applied to the vacuum suction device 400 contracts the inner space of the suction pad 401, aid inside the suction pad may be discharged. With the inside air discharged, the elastic restoring force of the suction pad 401 decreases the pressure of the inner space of the suction pad 401. Accordingly, the suction pad 401 may be kept sucked to the plane.

According to various embodiments, when a user wants to move an electronic device with the vacuum suction device 400, the user may easily separate the electronic device from a plane by rotating the electronic device, for example, the cam member 451 in a reverse direction of the first direction R. In an embodiment, the cam member 451 may further include a stopper surface 453*b* formed between every two adjacent inclined cam surfaces 453*a*, and the rotary shaft member 403 may also further include a stopper surface 431*b* formed between every two adjacent inclined cam surfaces 431*a*. If the cam member 451 rotates in the reverse direction of the first direction R, the stopper surfaces 453*b* and 431*b* may interfere with each other, thereby rotating the rotary shaft member 403 in the reverse direction of the first direction R. While the cam member 451 and/or the rotary shaft member 403 are rotating in the reverse direction of the first direction R, the suction pad 401 may be kept suck to the plane. For example, as the valve plate 441 rotates together with the rotary shaft member 403 with respect to the suction pad 401, the first vent hole(s) 411 may be opened, thereby facilitating removal of the suction pad 401 from the plane.

Figure 26:
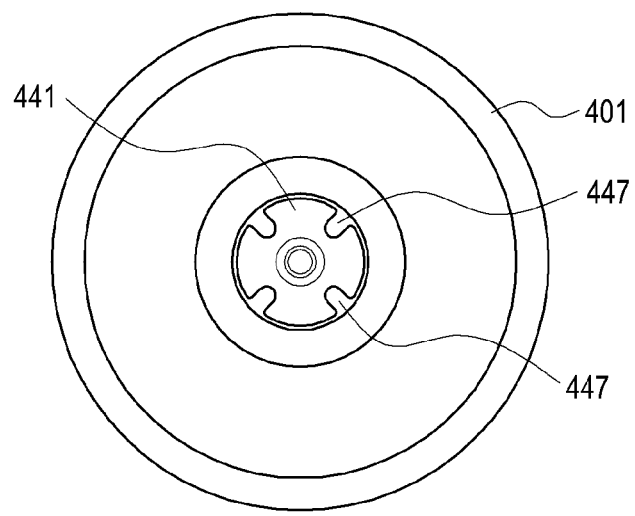
FIGS. 26 and 27 illustrate sectional views respectively of opened and closed states of a vent hole in a vacuum suction device according to another of various embodiments of the present disclosure.
Figure 27:
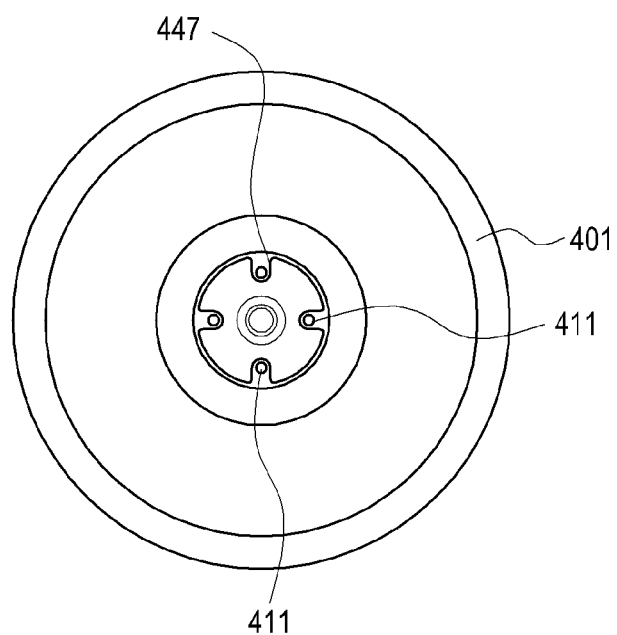

FIGS. 26 and 27 illustrates sectional views respectively of opened and closed states of a first vent hole(s) 411 in the vacuum suction device according to another of various embodiments of the present disclosure.

Referring to FIG. 26, with the first vent hole(s) 411 closed by the valve plate 441, the suction pad 401 may be kept sucked to the plane. If the cam member 451 rotates the rotary shaft member 403 and/or the valve plate 441 in the state where the suction pad 401 is sucked to the plane, the second vent hole(s) 447 may be aligned with the first vent hole(s) 411. Referring to FIG. 27, in the state where the second vent hole(s) 447 are aligned with the first vent hole(s) 411, external air may be introduced into the suction pad 401 through the second vent hole(s) 447 and/or the first vent hole(s) 411, and the suction force of the suction pad 401 may be eliminated. For example, in the state where an electronic device provided with the suction pad 401 is placed on a plane (for example, the suction pad 401 is sucked to the plane), the suction pad 401 and/or the electronic device may be easily removed from the plane by rotating the electronic device and/or the cam member 451.

As described above, according to various embodiments of the present disclosure, a vacuum suction device may include a suction pad having a concave inner surface, a vent hole penetrating from the inner surface of the suction pad to an outer surface of the suction pad, and a valve member disposed on the outer surface of the suction pad. As a pressure of a space formed by the inner space of the suction pad decreases, the valve member may close the vent hole from the outer surface of the suction pad.

According to various embodiments, the vacuum suction device may further include a mounting recess formed on the outer surface of the suction pad and connected to one end portion of the vent hole. The valve member may close the vent hole by closely contacting the mounting recess.

According to various embodiments, an inner circumferential surface of the mounting recess may be a curved surface having a predetermined curvature, and an outer circumferential surface of the valve member may be shaped at least partially in correspondence with the inner circumferential surface of the mounting recess.

According to various embodiments, with the valve member closing the vent hole, a part of the outer circumferential surface of the valve member corresponding to the inner circumferential surface of the mounting recess may be exposed outward from the mounting recess.

According to various embodiments, the valve member may rotate with respect to the suction pad, with the outer circumferential surface of the valve member slidingly contacting the inner circumferential surface of the mounting recess.

According to various embodiments, the vacuum suction device may further include a cover member engaged with the outer surface of the suction pad, and the valve member may be fixed on an inner surface of the cover member.

According to various embodiments, the vacuum suction device may further include a mounting recess formed at one end portion of the vent hole on the outer surface of the suction pad, and the valve member may close the vent hole by closely contacting the mounting recess.

According to various embodiments, an inner circumferential surface of the mounting recess may be a curved surface having a predetermined curvature, and an outer circumferential surface of the valve member may be shaped at least partially in correspondence with the inner circumferential surface of the mounting recess.

According to various embodiments, the vacuum suction device may further include a catching member extended from the outer surface of the suction pad, and an accommodation recess formed on the inner surface of the cover member, and a part of the catching member may be movably accommodated in the accommodation recess.

According to various embodiments, the accommodation recess may be shaped into a closed curve on the inner surface of the cover member, and the valve member may be fixed in an area surrounded by the accommodation recess.

According to various embodiments, the catching member may include an extension portion extended from the outer surface of the suction pad, and a flange portion curved from an end portion of the extension portion, while being tilted with respect to the extension portion, and at least the flange portion may be accommodated in the accommodation recess.

According to various embodiments, a vacuum suction device may include a suction pad having a concave inner surface, at least one first vent hole penetrating from the inner surface of the suction pad to an outer surface of the suction pad, a valve member engaged rotatably with the outer surface of the suction pad, and at least one second vent hole formed in the valve member. As the valve member rotates with respect to the suction pad, the at least one second vent hole is selectively aligned with the at least one first vent hole.

According to various embodiments, the valve member may include a rotation rod disposed on the outer surface of the suction pad, in close contact with one end portion of the at least one first vent hole, the at least one second vent hole may penetrate through the rotation rod, and as the rotation rod rotates, one end portion of the at least one second vent hole may be selectively connected to one end portion of the at least one first vent hole.

According to various embodiments, the valve member may further include a cam button for making a linear reciprocating movement on the outer surface of the suction pad, a first inclined cam surface formed at one end of the cam button, and a second inclined cam surface formed at one end of the rotation rod, and as the cam button makes a linear reciprocating movement, the first inclined cam surface and the second inclined cam surface may interfere with each other, thereby rotating the rotation rod.

According to various embodiments, the vacuum suction device may further include a mounting recess formed at one end portion of the at least one first vent hole on the outer surface of the suction pad, the valve member may rotate in close contact with an inner circumferential surface of the mounting recess, and the at least one second vent hole may penetrate through the rotation rod.

According to various embodiments, the valve member may be formed to surround at least a part of an outer circumferential surface of the suction pad.

According to various embodiments, a plurality of first vent holes extended along a radius direction of the suction pad may be arranged along a circumferential direction of the suction pad, and a plurality of second vent holes extended along a radius direction of the valve member may be arranged along a circumferential direction of the valve member.

According to various embodiments, the valve member may include a valve plate engaged rotatably with an outer circumferential surface of the suction pad, facing the outer circumferential surface of the suction pad, a rotary shaft member engaged vertically movably with the suction pad and the valve plate, and a cam member having an inclined cam surface interfering the rotary shaft member along with a vertical movement of the rotary shaft member. As the rotary shaft member moves up and down, the rotary shaft member may be interfered by the inclined cam surface, and rotate together with the valve plate with respect to the suction pad.

According to various embodiments, as the suction pad is sucked to a plane, the rotary shaft member may be interfered by the plane and move up and down with respect to the suction pad.

According to various embodiments, the valve member may further include an elastic member between the cam member and the rotary shaft member.

According to various embodiments, the valve member may further include a guide rib extended on one surface of the valve plate, along a vertical movement direction of the rotary shaft member, a guide hole formed in the guide rib, along the vertical movement direction of the rotary shaft member, and a guide protrusion formed on an outer circumferential surface of the rotary shaft member. The guide protrusion may be accommodated in the guide hole, and rotate the rotary shaft member and the valve plate together, while moving up and down with respect to the valve plate.

According to various embodiments, the at least one second vent hole may be formed in the valve plate.

According to various embodiments, as the rotary shaft member is interfered by the inclined cam surface and rotates together with the valve plate with respect to the suction pad, the at least one first vent hole may be closed by the valve plate.

According to various embodiments, an electronic device including the above vacuum suction device may further include a housing. The suction pad may be disposed on a bottom surface of the housing, and the valve member may be mounted in the housing to be interposed between the housing and the suction pad.

According to various embodiments, the suction pad may be deformed by the weight of at least the housing, and the concave space of the inner surface of the suction pad may be contracted.

As is apparent from the foregoing description, the vacuum suction device and/or the electronic device including the same may easily be moved and relocated because the suction pad is removed from a floor without the need for a user to directly raise up the suction pad. For example, as the electronic device is raised up or rotated, the valve member opens the vent holes, thereby facilitating removal of the vacuum suction device (for example, the suction pad) from the floor. In an embodiment, with the electronic device placed on the floor, the suction pad may be sucked to the floor by the weight of the electronic device. Therefore, the electronic device may be stably positioned and its fall-down may be prevented.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A vacuum suction device comprising:
a suction pad including a concave inner surface;
a catching member extended from an outer surface of the suction pad;
a cover member engaged with the outer surface of the suction pad;
an accommodation recess formed on an inner surface of the cover member;
a vent hole penetrating from the concave inner surface of the suction pad to the outer surface of the suction pad; and
a valve member fixed on the inner surface of the cover member while being disposed on the outer surface of the suction pad,
wherein as a pressure of a space, formed by the concave inner surface of the suction pad, decreases, the valve member closes the vent hole from the outer surface of the suction pad, and
wherein a part of the catching member is movably accommodated in the accommodation recess.

2. The vacuum suction device of claim 1, further comprising a mounting recess formed on the outer surface of the suction pad and connected to one end portion of the vent hole,
wherein the valve member closes the vent hole by closely contacting the mounting recess.

3. The vacuum suction device of claim 2, wherein an inner circumferential surface of the mounting recess is a curved surface comprises a predetermined curvature, and an outer circumferential surface of the valve member is shaped at least partially in correspondence with the inner circumferential surface of the mounting recess.

4. The vacuum suction device of claim 3, wherein with the valve member closing the vent hole, a part of the outer circumferential surface of the valve member corresponding to the inner circumferential surface of the mounting recess is exposed outward from the mounting recess.

5. The vacuum suction device of claim 3, wherein the valve member rotates with respect to the suction pad, with the outer circumferential surface of the valve member slidingly contacting the inner circumferential surface of the mounting recess.

6. The vacuum suction device of claim 1, further comprising a mounting recess formed at one end portion of the vent hole on the outer surface of the suction pad,
wherein the valve member closes the vent hole by closely contacting the mounting recess.

7. The vacuum suction device of claim 6, wherein an inner circumferential surface of the mounting recess is a curved surface comprises a predetermined curvature, and an outer circumferential surface of the valve member is shaped at least partially in correspondence with the inner circumferential surface of the mounting recess.

8. The vacuum suction device of claim 1, wherein the accommodation recess is shaped into a closed curve on the inner surface of the cover member, and the valve member is fixed in an area surrounded by the accommodation recess.

9. The vacuum suction device of claim 1, wherein the catching member comprises:
an extension portion extended from the outer surface of the suction pad; and
a flange portion curved from an end portion of the extension portion, while being tilted with respect to the extension portion, and
wherein at least the flange portion is accommodated in the accommodation recess.

10. An electronic device comprising:
a processor;
a communication unit operatively coupled to the processor; and
a vacuum suction device operatively coupled to the electronic device, wherein the vacuum suction device comprises:
a suction pad including a concave inner surface,
a catching member extended from an outer surface of the suction pad,
a cover member engaged with the outer surface of the suction pad,
an accommodation recess formed on an inner surface of the cover member,
a vent hole penetrating from the concave inner surface of the suction pad to the outer surface of the suction pad, and
a valve member fixed on the inner surface of the cover member while being disposed on the outer surface of the suction pad,
wherein as a pressure of a space, formed by the concave inner surface of the suction pad, decreases, the valve member closes the vent hole from the outer surface of the suction pad, and
wherein a part of the catching member is movably accommodated in the accommodation recess.

11. The electronic device of claim 10, further comprising a housing,
wherein the suction pad is disposed on a bottom surface of the housing, and the valve member is mounted in the housing to be interposed between the housing and the suction pad.

12. The electronic device of claim 11, wherein the suction pad is deformed by weight of at least the housing, and an inner space of the suction pad is contracted.

\* \* \* \* \*